United States Patent
Chiang et al.

(10) Patent No.: US 6,800,496 B1
(45) Date of Patent: Oct. 5, 2004

(54) CHARACTERIZATION METHODOLOGY FOR THE THIN GATE OXIDE DEVICE

(75) Inventors: Chung-Shi Chiang, Chaughua County (TW); Ke-Wei Su, Shan-Hua (TW); Chung-Kai Lin, Taipei (TW); Jaw-Kang Her, Hsin-Chu (TW); Yu-Tai Chia, San Jose, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/644,322

(22) Filed: Aug. 20, 2003

(51) Int. Cl.$^7$ .............................................. G01R 31/26
(52) U.S. Cl. ...................................................... 438/17
(58) Field of Search .................. 703/4; 716/4; 438/279, 438/347, 17; 257/336

(56) References Cited

U.S. PATENT DOCUMENTS

| | | | |
|---|---|---|---|
| 4,378,629 A | * | 4/1983 | Bozler et al. ................ 438/347 |
| 5,032,538 A | * | 7/1991 | Bozler et al. ................ 438/347 |
| 5,498,892 A | * | 3/1996 | Walker et al. ............... 257/336 |
| 6,246,973 B1 | * | 6/2001 | Sekine ........................... 703/4 |
| 6,337,249 B1 | * | 1/2002 | Yamane et al. ............. 438/279 |
| 6,378,109 B1 | * | 4/2002 | Young et al. ..................... 716/4 |
| 6,391,668 B1 | * | 5/2002 | Chacon et al. ................ 438/17 |

OTHER PUBLICATIONS

"Hole Injection SiO$_2$ Breakdown Model for Very Low Voltage Lifetime Extrapolation," K.F. Schuegraf et al., *IEEE Trans. Elec. Dev.*, vol. 41(5), pp. 761–767, May 1994.

"Modeling Gate and Substrate Currents due to Conduction- and- Valence-Band Electron and Hole Tunneling", W.C. Lee et al., *2000 Symp. on VLSI Tech.*, pp. 198–199, 2000.

1.5 nm Direct-Tunneling Gate Oxide Si MOSFET's, Hisayo Sakaki Momose et al., *IEEE Trans. Elec. Dev.*, vol. 43(8) pp. 1233–1242, Aug. 1996.

"BSIM4 Gate Leakage Model Including Source–Drain Partition," K.M. Cao et al., *2000 IEDM*, pp. 35.3.1–35.3.4.

*Operation and Modeling of the MOS Transistor*, Yannis P. Tsividis, McGraw Hill Book Co., NY, Copyright 1988, pp. 88–99.

* cited by examiner

*Primary Examiner*—John F. Niebling
*Assistant Examiner*—Andre' C. Stevenson

(57) ABSTRACT

A method of characterizing gate leakage current in the fabrication of integrated circuits is described. A MOSFET model is provided including a gate electrode deposed over a gate oxide layer on a substrate and source and drain regions associated with the gate electrode. Device current is measured at four terminals simultaneously wherein one of the terminals is a drain terminal. The other terminals are the source, gate, and substrate. The portion of the device current measured at the drain terminal that is contributed by gate current is evaluated. The evaluated gate current contribution is subtracted from the drain terminal current measurement to obtain pure drain current. Fitting procedures are performed to obtain curves for the device currents. The pure drain current is used to extract mobility model parameters.

10 Claims, 3 Drawing Sheets

CHARACTERIZATION METHODOLOGY FOR THE THIN GATE OXIDE DEVICE

BACKGROUND OF THE INVENTION (1) Field of the Invention

The present invention relates to the fabrication of integrated circuit devices, and more particularly, to a method of characterizing gate leakage current in the fabrication of integrated circuit devices.

(2) Description of the Prior Art

As gate oxide thickness is scaled down to 30 Angstroms and below, gate leakage current becomes important due to various direct-tunneling mechanisms shown in FIG. 1. FIG. 1 illustrates Current in amps as a function of gate voltage in volts where the substrate voltage, source voltage and drain voltage are 0. Line 11 shows the gate current or leakage current $I_g$. Line 12 shows the gate current in the reversed region. The graph shows that the level of $I_g$ is approaching the level of drain current at the high $V_g$ region. Under some bias conditions, the portion of the current measured from the drain terminal could be attributed to gate tunneling current. As a result, not only a good gate current model is needed, but also a good partitioning scheme is extremely important. A good partitioning method can separate the "real" drain current from the total measured drain current such that an accurate carrier mobility model is accessible.

There are quite a few publications that discuss gate current related issues. Some of these publications include: "Hole Injection SiO$_2$ Breakdown Model for Very Low Voltage Lifetime Extrapolation," by K. F. Schuegraf and C. Hu, *IEEE Trans. Elec. Dev.*, vol 41(5), p. 761, May 1994; "Modeling Gate and Substrate Currents due to Conduction- and Valence-Band Electron and Hole Tunneling," by W. C. Lee and C. Hu, 2000 *Symposium on VLSI Tech.*, p.198, 2000; "1.5 nm Direct-Tunneling Gate Oxide Si MOSFET's," by Hisayo Sakaki M. et al, *IEEE Trans. Elec. Dev.*, vol. 43(8), pp. 1233–1242, August 1996; and "Bsim4 Gate Leakage Model Including Source-Drain Partition," by K. M. Cao et al, 2000 IEDM, pp. 35.3.1–35.2.4.

However, there is no solid study for gate current partitioning into the various components of $I_g$; people just extract the gate current model with the drain/source/substrate model simultaneously. In other words, the total drain current is used to extract the mobility model. The portion of the drain current contributed by the gate current is evaluated implicitly during the mobility model extraction. In addition, since all terminal currents are extracted simultaneously, a considerable number of iterations may be needed to optimize the fitting results for all the terminals.

All of these published results are based on the much smaller order of gate current as compared with the drain current as shown in FIG. 2. For the drain voltage Vd=0.1, substrate voltage Vb=0 and source voltage=0, this graph shows $I_s \sim = I_d$ and thus, $I_g \ll I_d$. Since the gate current is much smaller than the drain current, one can extract the mobility model from the total drain current without seeing too much distortion. However, this is not true for high current cases. In these cases, the current from the gate terminal disturbs the curve measured at the drain terminal as shown in FIG. 3. These cases make the mobility parameters extraction extremely difficult. Also, more iterations are needed to optimize the fitting results because of this undecided mobility model. It is desired to find a method to overcome the gate current modeling problem for high gate current situations.

A number of patents address modeling issues. U.S. Pat. No. 6,246,973 B1 to Sekine discusses modeling channel width. U.S. Pat. No. 6,378,109 B1 to Young et al teaches a method to simulate a gate oxide integrity check. U.S. Pat. No. 6,391,668 B1 to Chacon et al shows a method of determining trap density from measured current.

SUMMARY OF THE INVENTION

Accordingly, it is a primary object of the invention to provide a method for characterizing gate leakage current in the fabrication of integrated circuits.

Another object of the invention is to provide a method for characterizing gate leakage current in high gate current situations.

A further object of the invention is to provide a method for characterizing gate leakage current in high gate current situations wherein the gate current contribution measured at the drain terminal can be evaluated.

Yet another object of the invention is to provide a method for characterizing gate leakage current in high gate current situations wherein the gate current contribution measured at the drain terminal can be evaluated and subtracted from the total drain current to leave the real drain current.

In accordance with the objects of the invention, a method of characterizing gate leakage current in the fabrication of integrated circuits is achieved. A MOSFET model is provided including a gate electrode deposed over a gate oxide layer on a substrate and source and drain regions associated with the gate electrode. Device current is measured at four terminals simultaneously wherein one of the terminals is a drain terminal. The other terminals are the source, gate, and substrate. The portion of the device current measured at the drain terminal that is contributed by gate current is evaluated. The evaluated gate current contribution is subtracted from the drain terminal current measurement to obtain pure drain current. Fitting procedures are performed to obtain curves for the device currents. The pure drain current is used to extract mobility model parameters.

BRIEF DESCRIPTION OF THE DRAWINGS

In the accompanying drawings forming a material part of this description, there is shown.

DESCRIPTION OF THE PREFERRED EMBODIMENTS

The process of the present invention provides a new methodology to characterize thin gate oxide devices in high gate current situations. For example, when gate current is comparable to drain current, $I_g$ is high. A new gate partitioning method is proposed to model gate leakage current especially in high gate current situations.

Figure 1:
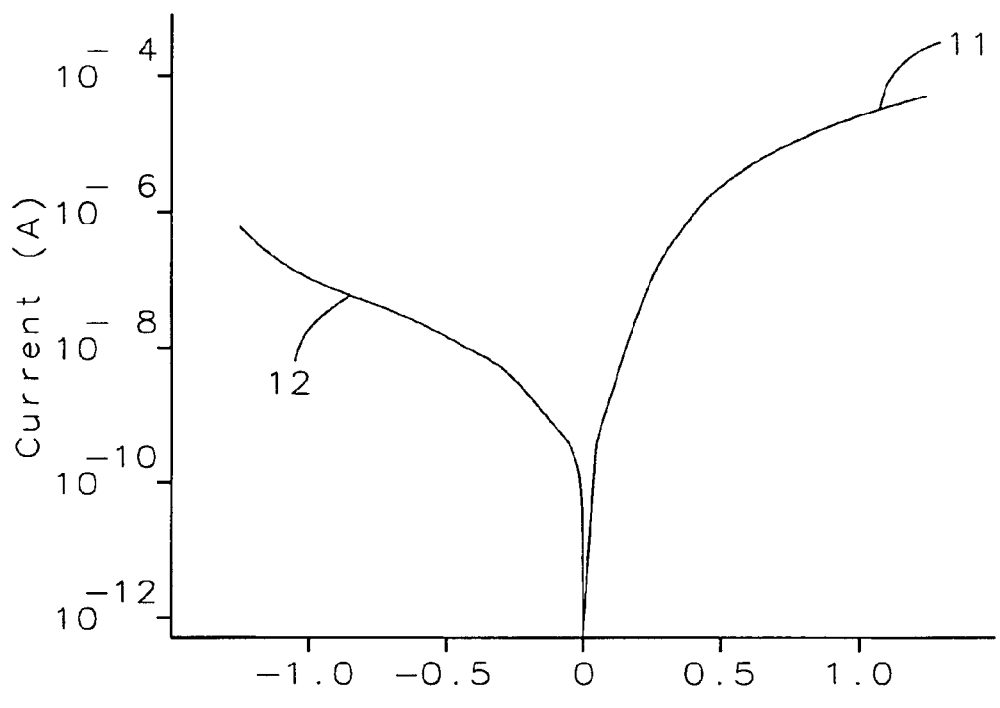
FIG. 1 is a graphical representation of gate leakage current.
Figure 2:
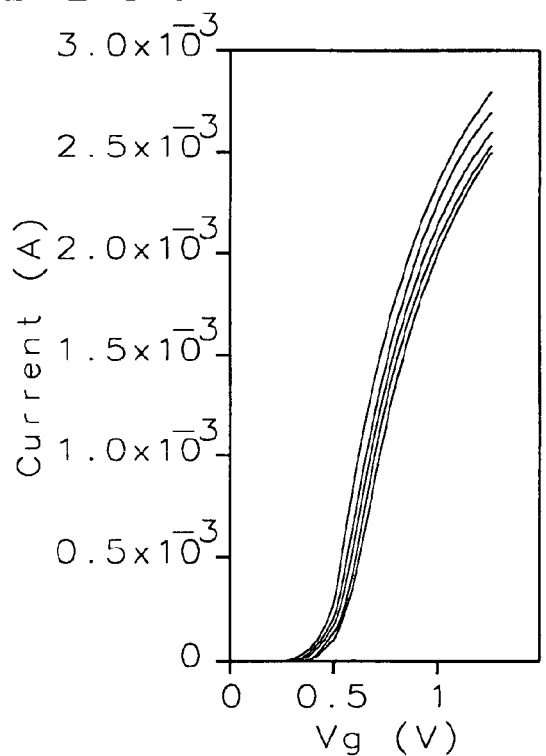
FIG. 2 is a graphical representation of gate current compared with drain current and source current.
Figure 3:
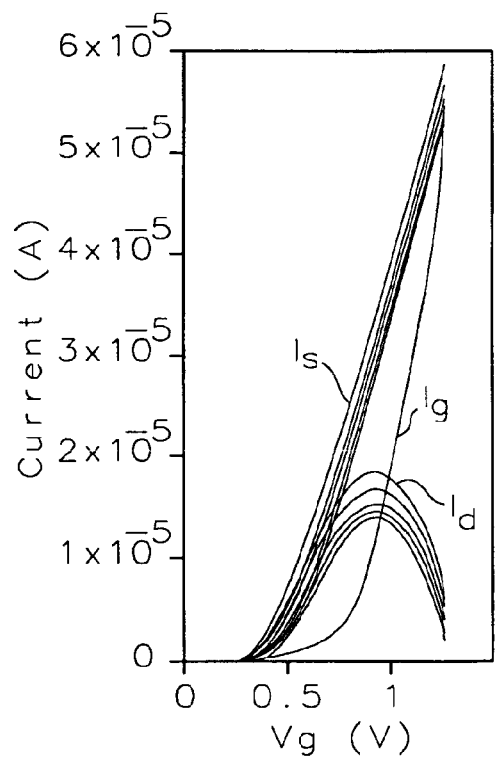
FIG. 3 is a graphical representation of gate current compared with drain current and source current where gate current is very high.
Figure 4:
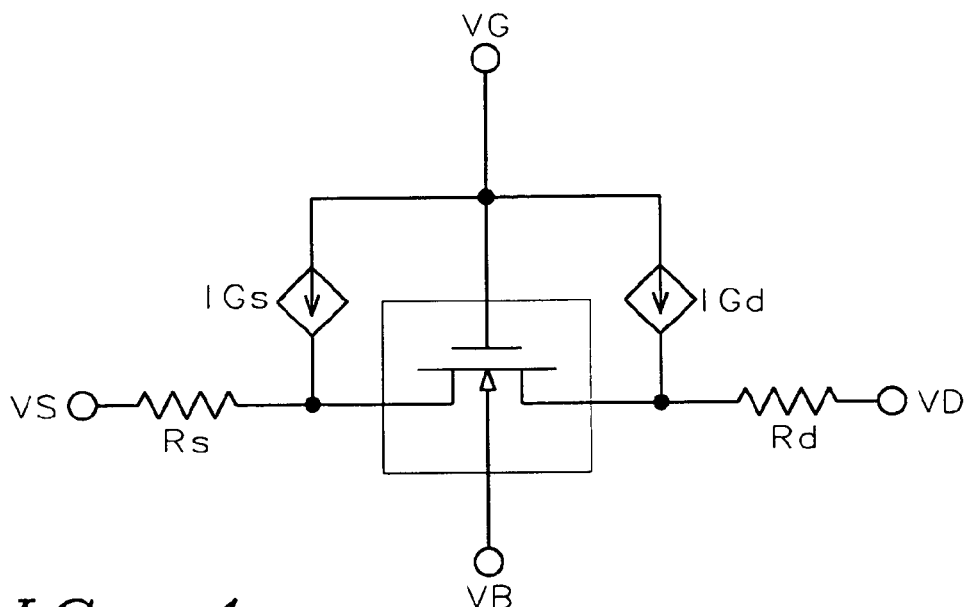
FIG. 4 is a circuit diagram of the macro-circuit model to be characterized.

FIG. 4 illustrates the equivalent circuit of the macro-circuit model, composed of gate-to-drain (Igd), gate-to-source (Igs) currents and an intrinsic MOSFET model. The two current sources represent the direct tunneling current between the gate and drain/source through the channel and overlap area.

Figure 5:
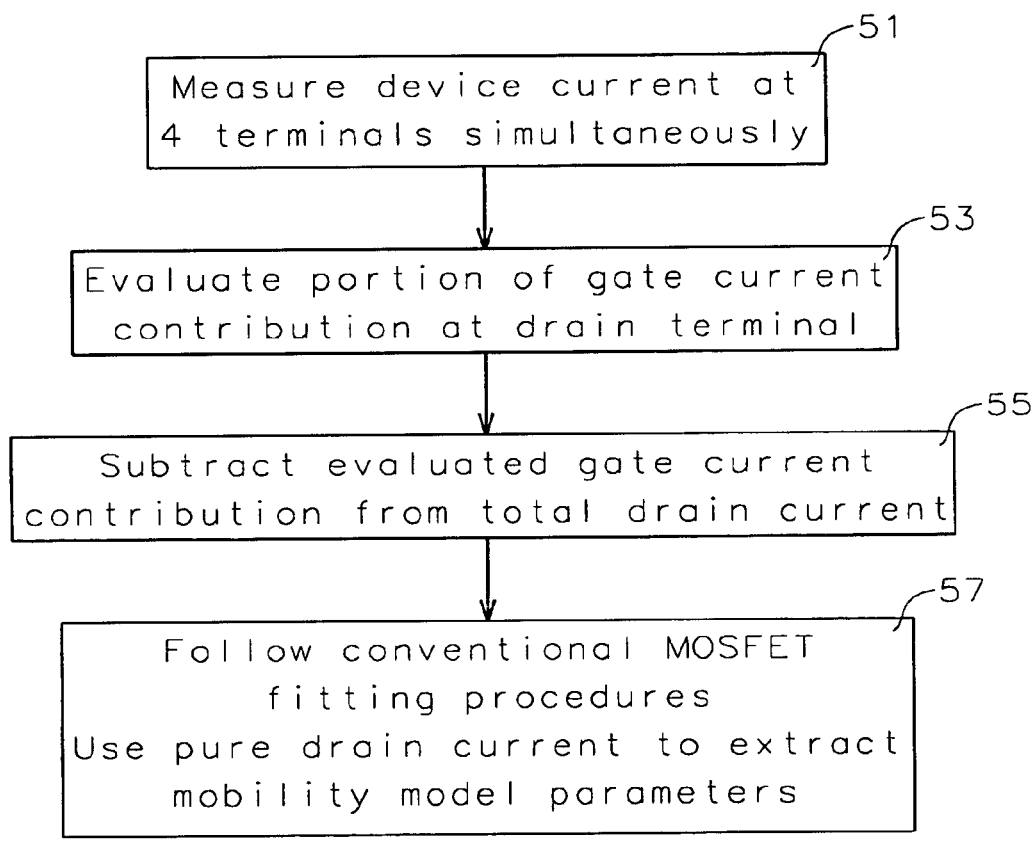
FIG. 5 is a flowchart of the methodology of the present invention.

As shown in FIG. 5, the methodology of the present invention begins with measurement of the device current at the four terminals, VS, VG, VD, and VS, simultaneously under the designed bias condition (step 51).

In step 53, the portion of the gate current contribution measured at the drain terminal is evaluated. The evaluation method is model-dependent. For example, one model that can be used is described hereinbelow. Other methods could be used to evaluate the gate current contribution at the drain terminal without departing from the spirit and scope of the invention.

One method of evaluating the portion of the gate current contribution measured at the drain terminal is presented here. The direct tunneling current model Igd/Igs can be given as follows:

$$Igx = Area * C * (Vox/tox)^2 e^{\frac{-B(1-(1-Vox/B)^{3/2})}{Vox/tox}} \quad (1)$$

where x could be source or drain; $_B$, tox, Vox are surface potential, physical oxide thickness, and voltage drop across the oxide, respectively; B and C are physical parameters. This equation (1) comes from the Shuegraf and Hu reference.

The inventors have invented an evaluation method as follows. The Taylor expansion can be applied to equation (1) so that the equation can be simplified further as below:

$$Igx = Area * C * (Vox/tox)2e^{-B*tox*(a+b*Vox)} \quad (2)$$

where a,b are constants. In order to evaluate Ig by the macro-circuit model, Vox should be related to Vgx and surface potential as follows:

$$Vox = Vgx - V_{fb} - s \quad (3)$$

However, surface potential can only be accurately obtained by an iterative numerical approach. Thus, the curve in *Operation and Modeling of the MOS Transistor*, by Y. P. Tsividis, McGraw-Hill Book Co, C. 1988, sec. 3.4, is used to find the relationship between applied voltage and surface potential:

$$s = vara - varb * \ln(Vgx) \quad (4)$$

where vara and varb are fitting parameters. The equation is an approximation of the curve.

From the equivalent circuit (FIG. 4) and the equations (2–4), gate current Ig=Igd+Igs can be rewritten as:

$$Ig = Igo * [f(Vgs) + f(Vgd)] \quad (5)$$

where Igo is a constant, Vgs is the applied external source voltage, and Vgd is the applied external drain voltage. As a result, Igs can be found easily by the normalized partition:

$$Igs = Ig * f(Vgs)/[f(Vgs) + f(Vgd)] \quad (6)$$

Igd can be obtained by the same method.

Figure 6:
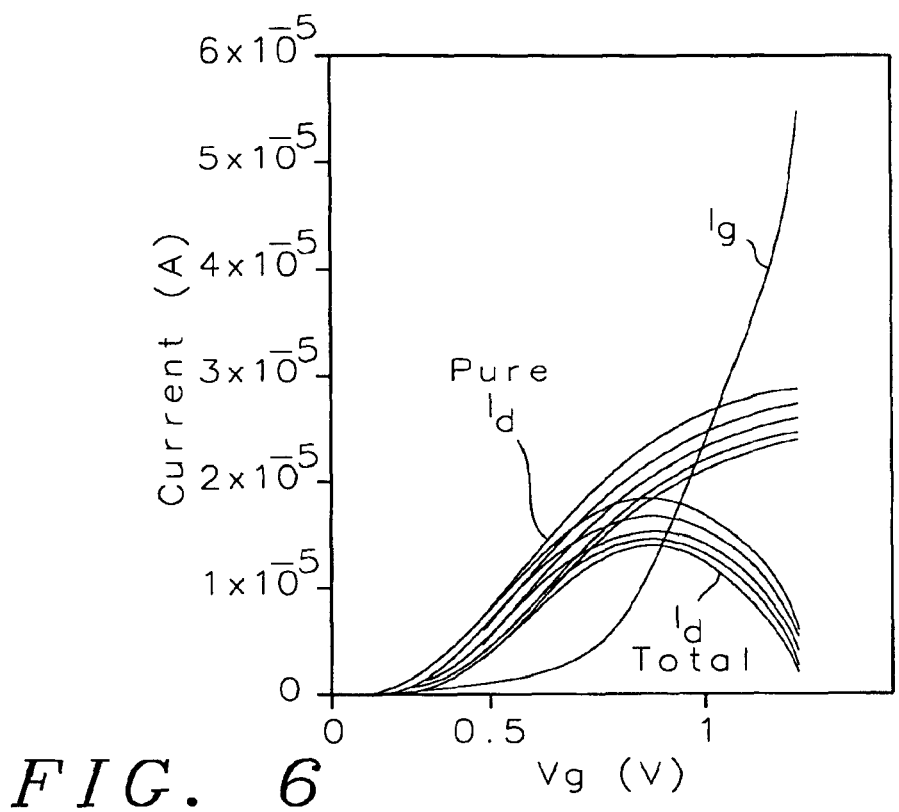
FIG. 6 is a graphical representation of gate leakage current using the partitioning method of the present invention.

Next, in step 55, the portion of the evaluated gate current contribution (Igd) is subtracted from the total drain current to find the pure drain current. As shown in FIG. 6, the curve of total_id represents the current measured at the drain terminal. The curve of pure_id is the real drain current without the gate current contribution from the drain terminal.

Now, in step 57, by following the conventional MOSFET fitting procedures, the pure drain current is used to extract the mobility model parameters. Whatever method is used for thick oxide model extraction can be applied here. For example, $I_d$ vs. $V_g$ curves can be used for linear region parameter extraction. $I_d$ vs. $V_d$ curves can be used for saturation region parameter extraction.

Make sure of current conservation for all the terminals. That is, $I_s + I_b + I_g + I_d = 0$. As long as the current is measured from all four terminals and the partitioning method of the present invention is followed, current conservation will be assured.

Figure 7:
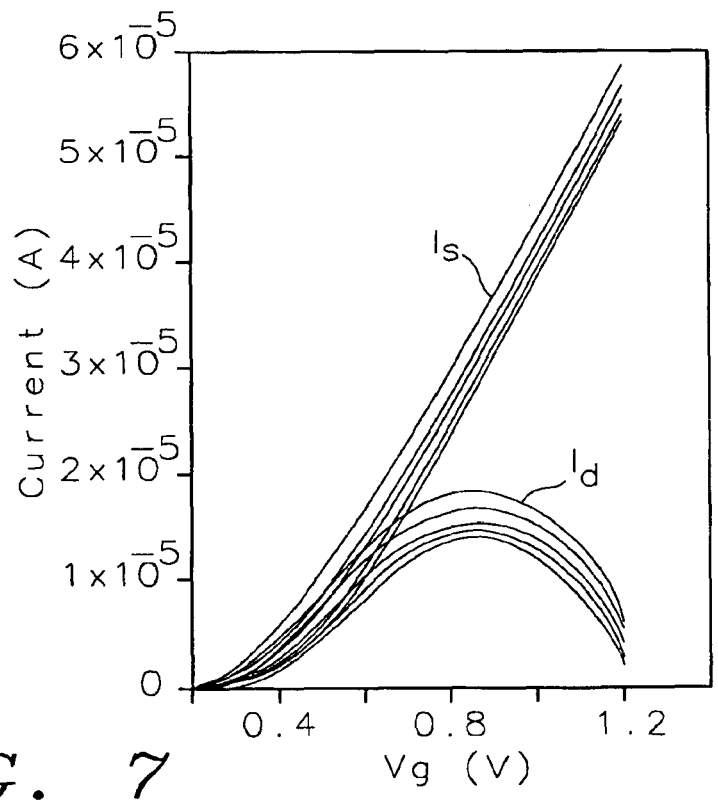
FIG. 7 is a graphical representation of simulated source and drain leakage current according to the process of the present invention.

The process of the present invention provides a current characterization methodology especially useful in high gate current modeling. With the process of the invention, a clean drain current is accessible to do mobility model extraction. A conventional MOSFET extraction methodology can be applied after the subtraction of the gate current contribution to the drain current. Fewer optimization iterations are required in this method to find the best fit. The simulated curves shown in FIG. 7 demonstrate good fitting for the drain and source measurements based on this methodology.

The process of the present invention in step number 53 can be implemented in a computer program.

While the invention has been particularly shown and described with reference to the preferred embodiments thereof, it will be understood by those skilled in the art that various changes in form and details may be made without departing from the spirit and scope of the invention.

What is claimed is:

1. A method of gate current characterization of a MOSFET wherein said MOSFET includes a gate electrode deposed over a gate dielectric layer on a substrate and source and drain regions associated with said gate electrode comprising:

measuring device current at a plurality of terminals simultaneously wherein one of said terminals is a drain terminal;

evaluating a portion of said device current measured at said drain terminal that is contributed by gate current;

subtracting said evaluated gate current contribution from said device current measured at said drain terminal to obtain pure drain current;

performing fitting procedures to obtain curves for said device currents; and using said pure drain current to extract mobility model parameters wherein said gate current of said MOSFET is characterized using said extracted mobility model parameters.

2. The method according to claim 1 wherein there are four terminals.

3. The method according to claim 2 wherein said four terminals comprise said drain terminal, a source terminal, a gate terminal, and a substrate terminal.

4. The method according to claim 1 wherein said step of evaluating a portion of said device current measured at said drain terminal that is contributed by gate current comprises:

following a direct tunneling current model, approximating said gate current by the applied external voltage; and partitioning said gate current so that current conservation is achieved.

5. The method according to claim 1 wherein said gate current is approximately equal to said pure drain current.

6. A method of gate current characterization of a MOSFET wherein said MOSFET includes a gate electrode deposed over a gate dielectric layer on a substrate and source and drain regions associated with said gate electrode comprising:

measuring device current at four terminals simultaneously wherein said terminals comprise a drain terminal, a source terminal, a gate terminal, and a substrate terminal;

evaluating a portion of said device current measured at said drain terminal that is contributed by gate current;

subtracting said evaluated gate current contribution from said device current measured at said drain terminal to obtain pure drain current;

performing fitting procedures to obtain curves for said device currents; and using said pure drain current to extract mobility model parameters wherein said gate current of said MOSFET is characterized using said extracted mobility model parameters.

7. The method according to claim 6 wherein said step of evaluating a portion of said device current measured at said drain terminal that is contributed by gate current comprises:

following a direct tunneling current model, approximating said gate current by the applied external voltage; and partitioning said gate current so that current conservation is achieved.

8. The method according to claim 6 wherein said gate current is approximately equal to said pure drain current.

9. A method of gate current characterization of a MOSFET wherein said MOSFET includes a gate electrode deposed over a gate dielectric layer on a substrate and source and drain regions associated with said gate electrode comprising:

measuring device current at four terminals simultaneously wherein said terminals comprise a drain terminal, a source terminal, a gate terminal, and a substrate terminal;

evaluating a portion of said device current measured at said drain terminal that is contributed by gate current wherein said evaluating comprises:

following a direct tunneling current model, approximating said gate current by the applied external voltage; and partitioning said gate current so that current conservation is achieved;

subtracting said evaluated gate current contribution from said device current measured at said drain terminal to obtain pure drain current;

performing fitting procedures to obtain curves for said device currents; and using said pure drain current to extract mobility model parameters wherein said gate current of said MOSFET is characterized using said extracted mobility model parameters.

10. The method according to claim 9 wherein said gate current is approximately equal to said pure drain current.

* * * * *